Jan. 6, 1970 J. R. DALE 3,488,234

SEMICONDUCTOR DEVICE

Filed July 16, 1964

INVENTOR.
JOHN R. DALE

BY
Frank R. Trifari
AGENT

United States Patent Office 3,488,234
Patented Jan. 6, 1970

3,488,234
SEMICONDUCTOR DEVICE
John Robert Dale, Brighton, England, assignor, by mesne assignments, to U.S. Philips Corporation, New York, N.Y., a corporation of Delaware
Filed July 16, 1964, Ser. No. 383,142
Claims priority, application Great Britain, July 17, 1963, 28,298/63
Int. Cl. H01l 7/04, 7/32
U.S. Cl. 148—33.4 9 Claims This invention relates to semiconductor devices comprising a junction between dissimilar semiconductors, hereinafter referred to as a heterojunction. A junction in the same semiconductor formed by different impurity concentrations is hereinafter referred to as a homojunction. The invention also relates to methods of manufacturing such semiconductor devices.

Figure 1:
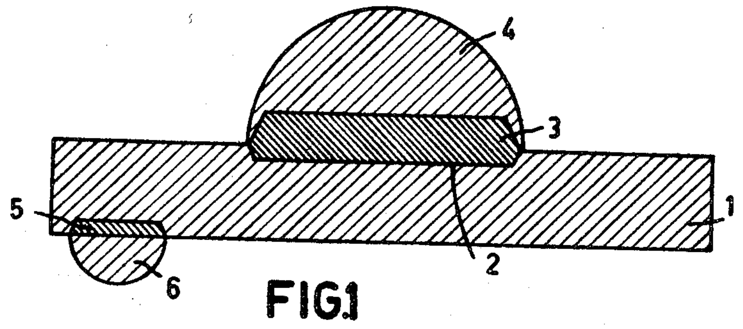

In copending patent application, Ser. No. 479,546, filed Aug. 13, 1965, now Patent No. 3,363,155 there is described and claimed an opto-electronic semiconductor device comprising a semiconductor body having a first, photon-emissive p-n junction capable of emitting photons with a quantum efficiency greater than 0.1 when suitably biased in the forward direction and a photosensitive part comprising a second, photo-sensitive p-n junction for transforming the energy of photons emanating from the first p-n junction to that of charge carriers when the second p-n junction is suitably biased in the reverse direction, the distance between the first p-n junction and the second p-n junction being at least one diffusion length from the first p-n junction of the charge carriers injected by that junction into the adjacent region of the body intermediate the first and second junctions. Such a device may be considered to correspond to a known p-n-p or n-p-n transistor in a sense that in both cases use is made of a p-n junction forming the electric input, which is biased in the forward direction, and of a p-n junction forming the electric output, biased in the reverse direction and the device may conveniently be referred to as an opto-electronic transistor or alternatively a "beam of light" transistor.

The present invention also includes devices of the type, described in the above-mentioned prior application, comprising a heterojunction between dissimilar semiconductors, but is not exclusively concerned therewith, for example, the invention also relates to other semiconductor devices such as p-n photo-diodes comprising heterojunctions, conventional transistors with heterojunction including wide band gap emitter transistors, and devices embodying n-n or p-p heterojunctions the operation of which depends only on the passage of majority carriers.

The said co-pending application also describes a device in which the photo-sensitive part consists of a semiconductor material having a smaller energy gap than the semiconductor material adjacent the first p-n junction, so that specifically in the photo-sensitive part an enhanced absorption and transformation is obtained. The specification further describes such a device in which the photo-sensitive part is provided by epitaxial growth on the semiconductor material adjacent the first p-n junction and also in which the second p-n junction substantially coincides with the boundary of the epitaxial layer. Thus the second p-n junction may consist of a heterojunction with the semiconductor material on that side of the second p-n junction remote from the first p-n junction of lower energy gap than the semiconductor material on the side of the second p-n junction adjacent the first p-n junction. Using the conventional terms in the transistor art the first p-n junction is the emitter-base junction and the second p-n junction is the collector-base junction. Thus in the above described device comprising a heterojunction at the second p-n junction the collector region is of a lower energy gap material than that of the base region.

In a letter from R. H. Rediker, T. M. Quist and B. Lax in Proc. I.E.E.E. January 1963, pages 218 and 219, a photo-diode structure is proposed in which the p-n junction is a heterojunction and in which the frequency response does not depend critically on the distance of the junction from the surface but rather depends on the relative absorption of the incident radiation in the two materials forming the heterojunction. A high speed response photo-diode containing a p-Ge, n-GaAs heterojunction is proposed as a detector for the 8450A. radiation emitted from a GaAs diode. If the junction is 10 mircons from the surface, the absorption coefficient of Ge at the wavelength of the emitted radiation being about $2.4\times10^4$ cm.$^{-1}$ and GaAs about 10 cm.$^{-1}$, most of the radiation is absorbed in the Ge within 1 micron of the junction. It is thus possible with suitable impurity concentrations and crystal orientations of the heterojunction interface, to have the space-charge region of Ge several times the absorption length. The absorption length is defined as the reciprocal of the absorption coefficient. The letter further proposes a "beam of light" transistor with an infra-red emitting GaAs p-n homojunction as emitter and an n-GaAs, p-Ge heterojunction as collector.

In p-n photo-diodes and opto-electronic transistors, heterojunctions between gallium arsenic and germanium have the advantages that the lattice constant of germanium (5.62 A.) matches that of GaAs (5.65 A.) to within 0.6% and the absorption length of light in the germanium is significantly smaller than in the gallium arsenide, for example the absorption length of the light emitted by a forward biased gallium arsenide p-n junction is about 1,000$\mu$ in n-type gallium arsenide whereas in p-type germanium it is about 0.3$\mu$ and the space-charge region of the heterojunction can be conveniently arranged to be several times this length so that efficient absorption is obtained. Photons absorbed within the space-charge region of the heterojunction generate electron-hole pairs.

Due to said generation of electron-hole pairs a photocurrent should pass through the p-n heterojunction due to the excess number of electrons generated in the p-type germanium. However, although, in principle all electrons generated should reach the p-n junction when biased in the reverse direction, the photocurrent is lower than expected. This phenomenom may be ascribed to the following explanation.

Due to the difference in band structure of gallium arsenide and germanium eectrons liberated within the p-type germanium region have to cross an energy barrier with a change of momentum in order to enter the n-type gallium arsenide region, that is, an electron in the minimum of the conduction band in germanium has a different momentum from an electron in the minimum of the conduction band in gallium arsenide and the passage across the junction therefore involves a change in momentum which is possibly acquired from a photon. Hence an n-gallium arsenside, p-germanium heterojunction while permittig very efficient absorption of photons and consequent generation of electron-hole pairs suffers from the disadvantage that the efficiency of collection of the carriers so liberated is influenced by this change of momentum of electrons entering the gallium arsenide from the germanium. In semiconductor devices comprising an n-n or p-p heterojunction, the operation of which depends only on the passage of majority carriers, when the band structures of the two semiconductor materials forming the heterojunction differ significantly then the efficiency of these devices may also be similarly influenced.

According to the invention a semiconductor device comprises a heterojunction between a body of a first III–V semiconductor compound and a region in the body of a solid solution epitaxially recrystallised from the liquid phase of the first III–V semiconductor compound and a second III–V semiconductor compound.

The advantages of such a device are firstly, the band structure of the semiconductor material of the first III–V semiconductor compound is essentially the same as that of the solid solution epitaxially recrystallised from the liquid phase so that, for example, in p-n photo-diodes and opto-electronic transistors, carriers generated by absorption of photons, when crossing the junction do not have to change their momentum as occurs, for example, in some heterojunctions between germanium and a III–V semiconductor compound. Second, the energy gap of the material of the solid solution region may be arranged to have a predetermined value by suitable choice of the relative proportions of the first and second III–V semiconductor compound in the epitaxially recrystallised solid solution region. Thus by suitably arranging the composition of the solid solution material its energy gap and hence also the absorption length in this material of light of a particular wave-length to which the reterojunction is photo-sensitive may be predetermined.

A further advantage of the device resides in that by epitaxial recrystallisation of the solid solution region from the liquid phase the heterojunction may be manufactured in a particularly simple manner and also to yield improved properties compared with such heterojunctions manufactured by alternative methods. Thus in a preferred form of the device the solid solution region is epitaxially recrystallised from a melt formed in the body on alloying to the body the second III–V semiconductor compound in a carrier material.

When alloying material to a semiconductor body a molten pool consisting of the material to be alloyed and an adjacent volume of the semiconductor body is produced and cooled. On cooling, first a crystallised part which forms an extension of the crystal lattice of the body and containing mainly the material of the body together with a small amount of the material to be alloyed, solidifies and is generally referred to as the recrystallised material and thereafter the remainder of the molten material consisting mainly of the material to be alloyed together with a small amount of the material of the semiconductor body solidifies and is generally referred to as the resolidified material. To obtain an epitaxial recrystallisation cooling may be carried out gradually as is known as such in forming alloy contacts onto semiconductors. An epitaxial growth, in the particular case under consideration being from the liquid phase, is that which exibits a crystal orientation related to that of the substrate on which the growth occurs.

In connection with the growth of solid solutions of two III–V semiconductor compounds from the vapour phase, in the Journal of the Electrochemical Society, March 1962, page 226, synthesis of homogeneous solid solutions of gallium phosphide and gallium arsenide by the vapour transport of these materials in an iodine gas stream onto a cooled substrate on which the solid solution is deposited is described. This method, however, is complicated with respect to simple alloying technics according to the invention.

With the aid of the carrier material a solid solution region of the first and second III–V semiconductor compounds may be epitaxially recrystallised from a melt formed in the body on alloying at temperatures significant lower than the melting point of the individual compounds. Notwithstanding the large number of components present in the melt formed in the alloying process (at least four), and the low temperature of the process, the III–V compounds, on cooling, segregate first and epitaxially deposit on the substrate in the form of a solid solution of the III–V compounds dissolved in the melt, and not in separate solid III–V phases of each of these compounds. Thus the advantage arises that the heterojunction between the body and the epitaxially recrystallised solid solution region is produced by an alloying process at a temperature significantly lower than that required to form the heterojunction by diffusion techniques or by epitaxial growth of the solid solution from the vapour phase. This results in that at the comparatively low temperatures required for alloying for example, 550° C., decomposition of the III–V compound of the substrate and the diffusion of any of the elements of the III–V compounds or any additional significant impurity element contained therein does not occur to any significant extent. Further advantages are that the heterojunction formed by an alloying process may be confined to a limited area of the body, the junction so formed may have a lower capacitance than occurs in a similar junction formed by epitaxial growth from the vapour phase or diffusion techniques, the ohmic contact to the solid solution region may be formed simultaneously and due to the said absence of any substantial diffusion, when the heterojunction is between materials of opposite conductivity type, the heterojunction may be conveniently arranged to be situated at the location of the p-n junction.

In the device according to the invention the epitaxially recrystallised solid solution region may be of a lower energy gap material than the first III–V semiconductor compound. Such a structure may be advantageously employed, for example, in a p-n photo-diode or in an opto-electronic transistor in which the solid solution region will form the collector region. The energy gap of the solid solution region is determined by the relative proportions of the two III–V semiconductor or compounds therein and will lie between the energy gap of the first III–V semiconductor compound and that of the second III–V semiconductor compound. The choice of III–V compounds present in the solid solution is determined by the characteristics require of the device and the ratio of the solubilities of the III–V compounds in the carrier material should be comparable to the composition ratio of the compounds in the solid solution.

The first III–V semiconductor or compound and the second III–V semiconductor compound may have a group III or a group V element common to both compounds.

The first III–V semiconductor compound may be gallium arsenide and the second III–V semiconductor compound may be, for example, gallium antimonide or indium arsenide.

The first III–V semiconductor compound may be a mixed crystal consisting of at least one group III element and more than one group V element or of at least one group V element and more than one group III element, for example, the first III–V semiconductor compound may be a mixed crystal of gallium arsenide and gallium phosphide having the composition $GaAs_xP_{1-x}$ the subscripts denoting atomic proportions and the value $x$ being greater than zero and less than unity. The mixed crystal may, for example, consist of a solid solution epitaxially recrystallised from the liquid phase, or may, for example, have been formed by diffusion or vapour growth techniques.

The carrier material must be such that the first and second III–V semiconductor compounds must have a sufficient solubility in the carrier material in the liquid state but with appreciably smaller solid solubility. The action of the carrier material generally is to dissolve a portion of the first III–V semiconductor compound in the melt which with the second III–V semiconductor compound of the material alloyed and contained in the melt forms the solid solution on cooling and epitaxially recrystallising. The carrier material may consist of a single element, for example, bismuth, lead, tin, cadmium, or may consist of an alloy of more than one element, for example an alloy of bismuth and tin or an alloy of bismuth, tin and platinum. The carrier material may or may not act as a significant impurity to influence the conductivity and/or the conductivity type in the solid solution region. The carrier material may be associated with additional significant impurity materials affecting the conductivity without affecting the conductivity type or affecting both the conductivity and the conductivity type of the solid solution region.

The device may comprise a further junction, which in certain instances may be a heterojunction, between the epitaxially recrystallised solid solution region and a further solid solution region also epitaxially recrystallised from the liquid phase and of different composition and/or different impurity concentration to the other solid solution region. This further junction may be formed during the epitaxial recrystallisation from the same melt and may appear as a thin layer between the solid solution of the first and second III–V compounds and the resolidified material which will consist predominantly of the carrier material.

The heterojunction may be between regions of the same or different conductivity types.

According to a further aspect of the invention in a method of manufacturing a semiconductor device comprising a heterojunction between a body of a first III–V semiconductor compound and a region in the body of a solid solution of the first III–V semiconductor compound and a second III–V semiconductor compound, the solid solution region is epitaxially recrystallised from the liquid phase. The solid solution region may be epitaxially recrystallised from a melt formed in the body on allowing material to the body consisting of the second III–V semiconductor compound material in a carrier material.

The material alloyed may additionally contain a material which acts as a significant impurity affecting the conductivity without affecting the conductivity type or affecting both the conductivity and the conductivity type of the recrystallised solid solution region.

When a significant impurity material is alloyed the concentration in the epitaxially recrystallised solid solution region will be appreciably less than its initial concentration in the material alloyed.

The materials may all be alloyed to the body together by placing a pellet consisting of an alloy or intimate mixture of the materials on the body and heating. As an alternative the materials to be alloyed may first be melted together and brought into contact in a molten state with the body.

If the first III–V semiconductor compound is gallium arsenide and the second III–V semiconductor compound material is gallium antimonide, using bismuth as a carrier material the proportions of the material alloyed may vary from a trace of gallium antimonide with the remainder bismuth to 40 parts by weight gallium antimonide and 60 parts by weight bismuth. Proportions which may be preferable are 20 parts by weight gallium antimonide and 80 parts by weight bismuth.

If the first III–V semiconductor compound is gallium arsenide and the second III–V semiconductor compound is indium arsenide, using bismuth as a carrier material the proportions of the material alloyed may vary from 5 parts by weight of indium arsenide and 95 parts by weight bismuth to 25 parts by weight indium arsenide and 75 parts by weight bismuth. Proportions which may be preferable are 80 parts by weight bismuth and 20 parts by weight indium arsenide.

Instead of bismuth as a carrier material other carrier materials may be used or mixtures of bismuth and other metals as carrier materials such as bismuth tin alloys, for instance 45 parts bismuth and 55 parts tin.

The proportions given above, when alloying gallium antimonide or indium arsenide in a bismuth carrier to a gallium arsenide body of n-type being uniformly doped with tellurium in a concentration of $10^{16}$ to $10^{17}$ atom/cc., will normally result in a p-type epitaxially recrystallised solid solution region.

It is, however, pointed out that for a heavily doped body the conductivity type of the epitaxially recrystallised solid solution region may be determined by a significant impurity with which the body is initially heavily doped.

The amount of significant impurity material alloyed will usually be small compared with the total amount of material alloyed and may typically be about 2% of the weight of the material alloyed but in certain instances may vary between a trace up to 50% by weight. The conductivity type of the epitaxially recrystallised solid solution region will in general be determined by the significant impurity material alloyed but also depends on the materials concerned, their relative concentrations, and the alloying conditions in a manner that cannot be exactly predetermined but is consistent and may readily be determined by experiment in a particular case. For gallium arsenide, the epitaxially recrystallised solid solution region obtained on alloying gallium antimonide or indium arsenide in a bismuth carrier without additional significant impurity to p or n type body will generally be of p-type conductivity, depending of course on the initial doping of the body. The addition of significant impurities such as cadmium, zinc or manganese will generally give p-type epitaxially recrystallised solid solution regions and their concentrations by weight of the material alloyed when consisting of a III–V compound in a carrier of bismuth are summarised as follows:

For cadmium the concentration in the material alloyed may vary from a trace up to 10%, preferably 2%, for zinc a trace up to 2%, for manganese a trace up to 2%. Using such materials the material to be alloyed may be prepared by forming an alloy of bismuth and the significant impurity to which a finely ground amount of the second III–V semiconductor compound is added and the whole heated in an evacuated tube and rapidly cooled. If the impurity is cadmium and the second III–V semiconductor compound is gallium antimonide a bismuth-cadmium alloy is first prepared containing 2% by weight cadmium. Finely ground gallium antimonide (20% by weight) is added to this alloy and the whole heated in an evacuated silica tube at 800° C. and thereafter rapidly cooled.

When the III–V compound body is gallium arsenide alloying of gallium antimonide or indium arsenide with a bismuth carrier may be carried out at 500° C.–600° C. at which temperature the materials do not appear to be unstable. The use of higher temperature may result in a loss of arsenic from the body. Alloying may be effected in an inert gaseous atmosphere, for example in argon or alterantively alloying may be effected in vacuo or a reducing atmosphere.

The duration of heating necessary for alloying may be from 15 mins. to 2 hours. Cooling from the alloying temperature may be during a period of 2 to 6 hours and the rate of cooling adjusted as is necessary for the materials concerned in order to obtain a satisfactory epitaxially recrystallised solid solution region.

When alloying to gallium arsenide, the bodies may be produced from a single crystal by slicing which may be followed by dicing. It is found that, as is usual, the results of alloying vary according to the crystal orientation of the face of the body to which alloying is effected.

Figure 2:
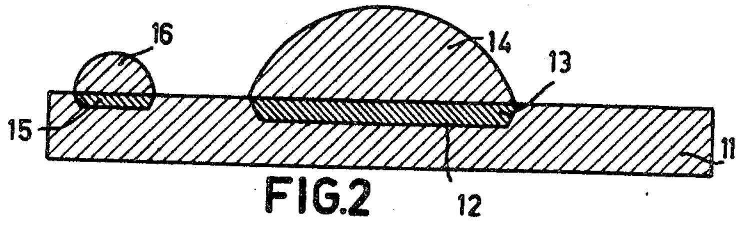

Two embodiments of semiconductor devices according to the invention will now be described, by way of example, together with details of their method of manufacture according to the invention, with reference to the accompanying diagrammatic drawing in which FIGURES 1 and 2 show vertical cross-sections of two diodes.

In a first embodiment shown in FIGURE 1 a diode comprises a wafer shaped body 1 of n-type gallium arsenide doped with tellurium in a concentration of $10^{17}$ atom/cc. in which a heterojunction 2 is present on one side of the body between the body and a p-type epitaxially recrystallised solid solution region 3 of gallium arsenide and gallium antimonide. The composition of the solid solution is about 85% gallium antimonide and 15% gallium arsenide. Situated above the recrystallised solid solution region is a solidified region 4 which projects above the surface of the wafer and forms an ohmic contact to the p-type epitaxially recrystallised solid solution region and consists mainly of bismuth. The heterojunction interface is flat and is at a depth of about 10 microns from the upper surface of the body 1. The recrystallised solid solution region has a thickness of about 55 microns. Near one end of the body on the opposite surface an ohmic contact to the n-type wafer consists of a recrystallised region 5 of gallium arsenide a resolidified region 6 projecting beyond the surface and consisting mainly of a bismuth-tin-platinum alloy. The diode has a rectification ratio of about $2 \times 10^3$, and is very sensitive for radiation emitted by a gallium arsenide p-n junction.

The diode is manufactured from single crystal gallium-arsenide uniformly doped with tellurium in a concentration of $10^{17}$ atoms/cc. and a wafer-shaped body of dimensions 3 mm. x 3 mm. x ½ mm. is obtained by slicing and dicing and etching in a conventional manner. The dice is lapped with 15 micron alumina grinding powder. Immediately prior to alloying, the dice is etched in a 10–30% solution of bromine in methanol of 0° C. and washed in ethyl alcohol. The body is placed in a carbon graphite jig and on one surface a 2 mm. diameter pellet of an alloy of bismuth (80%) and gallium antimonide (20%) is prewetted to the body. A ½ mm. diameter pellet of bismuth-tin-platinum alloy is placed at one end of the opposite surface of the body and the whole assembly is sealed off in an evacuated enclosure and heated at 550° C. for two hours. After heating, the assembly is slowly cooled, still in vacuo, for three hours to ambient temperature. The jig is then removed from the enclosure and the wafer-shaped body removed from the jig. Connecting wires of platinum, not shown, are soldered to the resolidified regions subsequent to giving the body a light etch in a solution of bromine (30%) in methanol. The diode may then be encapsulated in a manner known as such.

In a second embodiment, shown in FIGURE 2, a photodiode comprises a wafer shaped body, shown in FIGURE 2, a photodiode of n-type gallium arsenide doped with tellurium in a concentration of $5 \times 10^{16}$ atoms/cc. in which a heterojunction 12 is present on one side of the body between the body and a p-type epitaxially recrystallised solid solution region of gallium arsenide and indium arsenide. The composition of the solid solution is about 15% indium arsenide and 85% gallium arsenide. Situated above the recrystallised solid solution region is a resolidified region 14 which projects above the surface of the body and forms an ohmic contact to the p-type epitaxially recrystallised solid solution region and consists mainly of bismuth and cadmium. The heterojunction interface is flat, is at a depth of 30 microns from the surface and the recrystallised solid solution region has a thickness of about 30 microns. On the same surface of the body an ohmic contact to the n-type wafer consists of a recrystallised region 15 of gallium arsenide situated beneath a resolidified region 16 projecting beyond the surface and consisting mainly of the bismuth-tin-platinum alloy. The diode has a rectification ratio of about $2 \times 10^3$, and is sensitive for radiation emitted by a gallium arsenide pn junction.

The diode is manufactured from single crystal gallium arsenide uniformly doped with tellurium in a concentration of $5 \times 10^{16}$ atoms/cc. and a wafer shaped body of dimensions 3 mm. x 2 mm. x 150$\mu$ is obtained by slicing, dicing and etching in a conventional manner. The dice is lapped with 15 micron alumina grinding powder. Immediately prior to the alloying the wafer is etched in a 10–30% solution of bromine in methanol at 0° C. and washed in ethyl alcohol. The body is placed in a carbon graphite jig and on one surface a 1 mm. diameter pellet of an alloy of bismuth (78), cadmium (2%) and indium arsenide is prewetted to the body. A ½ mm. diameter pellet of bismuth-tin-platinum alloy is placed on the opposite surface of the body and the whole assembly is sealed off in an evacuated enclosure and heated at 580° C. for one hour. After heating the assembly is slowly cooled, still in vacuo, for four hours to ambient temperature. The jig is removed from the enclosure and the wafer-shaped body removed from the jig. Connecting wires of platinum, not shown, are soldered to the resolidified regions subsequent to giving the body a light etch in a solution of bromine (30%) in methanol. The diode may then be encapsulated in a manner known as such.

What is claimed is:

1. A semiconductor device comprising a monocrystalline body of a first III–V compound semiconductor, a mass of bismuth-containing metal fused and alloyed to a surface portion of said body forming within the body a monocrystalline recrystallized region epitaxially related to the body, said recrystallized region being composed of a solid solution of said first III–V compound semiconductor and of a second III–V compound semiconductor of a different composition from said first compound, said region forming a heterojunction with the adjacent body portion.

2. A device as set forth in claim 1 wherein the body compound contains more than one III or V element.

3. A device as set forth in claim 2 wherein the body compound has the composition $GaAs_xP_{1-x}$, wherein $x$ is greater than 0 and less than unity.

4. A semiconductor device comprising a monocrystalline body of a first III–V compound semiconductor, a mass of a carrier metal predominantly of bismuth fused and alloyed to a surface portion of said body forming within the body a monocrystalline recrystallized region epitaxially related to the body, said recrystallized region being composed of a solid solution of said first III–V compound semiconductor and of a second III–V compound semiconductor of a different composition from said first compound, said region forming a heterojunction with the adjacent body portion, said second compound being included in said carrier metal as a minor constituent.

5. A semiconductor device as set forth in claim 4 wherein the recrystallized region has a smaller band-gap than that of the body.

6. A semiconductor device as set forth in claim 4 wherein the first and second compounds have a common III or V element.

7. A semiconductor device as set forth in claim 6 wherein the first compound is GaAs, and the second compound is GaSb or InAs.

8. A semiconductor device as set forth in claim 4 wherein the carrier is bismuth or an alloy of bismuth and tin.

9. A device as set forth in claim 4 wherein the carrier includes in addition a minor amount of a significant impurity for modifying the conductivity or conductivity type of the recrystallized region.

References Cited

UNITED STATES PATENTS

| | | | |
|---|---|---|---|
| 2,798,989 | 7/1957 | Welker | 148—173 |
| 2,847,337 | 8/1958 | Gremmelmaier et al. | 148—33.6 |
| 2,956,216 | 10/1960 | Jenny et al. | 148—33.6 |
| 3,057,762 | 10/1962 | Bans | 148—171 |
| 3,218,205 | 11/1965 | Ruehrwein | 148—175 |
| 3,249,473 | 5/1966 | Holonyak | 148—175 |
| 3,302,051 | 1/1967 | Galginaitis | 148—33.4 |

L. DEWAYNE RUTLEDGE, Primary Examiner

PAUL WEINSTEIN, Assistant Examiner

U.S. Cl. X.R.

117—201; 148—171, 172, 177, 33.6, 179, 173, 1.5; 317—234, 235